United States Patent
Green et al.

(10) Patent No.: US 10,558,778 B2
(45) Date of Patent: Feb. 11, 2020

(54) DOCUMENT IMPLEMENTATION TOOL FOR PCB REFINEMENT

(71) Applicant: International Business Machines Corporation, Armonk, NY (US)

(72) Inventors: David Green, Austin, TX (US); Diana D. Zurovetz, Round Rock, TX (US); Julio A. Maldonado, Austin, TX (US); Michael Christo, Round Rock, TX (US)

(73) Assignee: International Business Machines Corporation, Armonk, NY (US)

( * ) Notice: Subject to any disclaimer, the term of this patent is extended or adjusted under 35 U.S.C. 154(b) by 22 days.

(21) Appl. No.: 15/943,793

(22) Filed: Apr. 3, 2018

(65) Prior Publication Data

US 2019/0303521 A1    Oct. 3, 2019

(51) Int. Cl.
*G06F 17/50* (2006.01)
*G06Q 10/06* (2012.01)

(52) U.S. Cl.
CPC ....... *G06F 17/5068* (2013.01); *G06Q 10/063* (2013.01)

(58) Field of Classification Search
CPC .................................................. G06F 17/5068
USPC .......................................................... 716/112
See application file for complete search history.

(56) References Cited

U.S. PATENT DOCUMENTS

| | | | |
|---|---|---|---|
| 6,246,788 B1* | 6/2001 | Pattikonda | G01N 21/9501 257/E21.525 |
| 6,535,776 B1* | 3/2003 | Tobin, Jr. | G01N 21/8851 257/E21.525 |
| 7,921,404 B2 | 4/2011 | Lingambudi et al. | |
| 2005/0001646 A1* | 1/2005 | Chung | G09G 3/006 324/760.02 |
| 2005/0251370 A1* | 11/2005 | Li | G01R 31/31707 702/190 |
| 2005/0275552 A1* | 12/2005 | Chamberlin | H05K 1/0256 340/647 |

(Continued)

FOREIGN PATENT DOCUMENTS

WO    2015131457 A1    9/2015

OTHER PUBLICATIONS

Green et al., "Document Implementation Tool for PCB Refinement," U.S. Appl. No. 15/943,796, filed Apr. 3, 2018.

(Continued)

*Primary Examiner* — Suchin Parihar
(74) *Attorney, Agent, or Firm* — Jared C. Chaney

(57) ABSTRACT

The present disclosure provides a method, computer program product, and system of document implementation tool for pcb refinement. In some embodiments, the system includes a current data object with at least a PCB design, a PCB data store, a feature identifier configured to identify one or more features in at least the current PCB design, a comparison engine, configured to compare features in the current PCB design and known features in the PCB data store, a classification engine configured to classify one or more discrepancies between the current PCB design and the PCB data store based on a size of each of the one or more discrepancies, a determination engine configured to determine changes needed to resolve the one or more discrepancies, and a reporting engine configured to report the one or more discrepancies to a user.

20 Claims, 7 Drawing Sheets

(56) References Cited

U.S. PATENT DOCUMENTS

| | | | |
|---|---|---|---|
| 2006/0218516 A1 | 9/2006 | McLain et al. | |
| 2010/0122224 A1* | 5/2010 | Lucas | G03F 1/36 |
| | | | 716/136 |
| 2010/0245813 A1* | 9/2010 | Margalit | G01N 21/956 |
| | | | 356/237.5 |
| 2019/0147134 A1* | 5/2019 | Wang | G06F 17/5081 |

OTHER PUBLICATIONS

List of IBM Patents or Patent Applications Treated as Related, dated Apr. 2, 2018, 2 pages.

Mell et al., "The NIST Definition of Cloud Computing," Recommendations of the National Institute of Standards and Technology, US Department of Commerce, Special Publication 800-145, Sep. 2011, 7 pages.

* cited by examiner

DOCUMENT IMPLEMENTATION TOOL FOR PCB REFINEMENT

BACKGROUND

The present disclosure relates to printed circuit board (PCB) design, and more specifically, to a document implementation tool for pcb refinement. PCBs are physical components for computer systems and other electronic devices. PCBs are resin or plastic boards with metal lines or pads connecting various electrical components together. Printed circuit boards require significant design effort to lay out the circuit for automated manufacturing. Specialized cad software is utilized to design PCBs for mass-production.

SUMMARY

The present disclosure provides a method, computer program product, and system of document implementation tool for pcb refinement. In some embodiments, the system includes at least one processor, a current data object with at least a current printed circuit board (PCB) design, a PCB data store comprising a plurality of data objects, where the plurality of data objects comprises at least one of one or more previous queries, PCB data, one or more PCB rules, one or more previous PCB designs, and dispositions, where the plurality of data objects has known features, a feature identifier configured to identify one or more features in at least the current PCB design, a comparison engine, configured to compare features in the current PCB design and known features in the PCB data store, a classification engine configured to classify one or more discrepancies between the current PCB design and the PCB data store based on a size of each of the one or more discrepancies, a determination engine configured to determine changes needed to resolve the one or more discrepancies, and a reporting engine configured to report the one or more discrepancies to a user.

In some embodiments, the method and computer program product include receiving a current data object with at least a current printed circuit board (PCB) design, receiving, by a computer system, an PCB data store comprising a plurality of data objects, where the plurality of data objects comprises at least one of one or more previous queries, PCB data, one or more PCB rules, one or more previous PCB designs, and dispositions, where the plurality of data objects has known features, identifying, by a feature identifier, one or more features in at least the current PCB design, comparing, by a comparison engine, identified features in the current PCB design and known features in the PCB data store, classifying, by a classification engine, one or more discrepancies between the current PCB design and the PCB data store based on a size of each of the one or more discrepancies, determining, by a determination engine, changes needed to resolve the one or more discrepancies, and reporting, by a reporting engine, the one or more discrepancies to a user via a display logically connected to the computer system.

In some embodiments, the system includes at least one processor, a current data object with at least a current PCB design, a printed circuit board (PCB) data store comprising a plurality of data objects, where the plurality of data objects comprises at least one of one or more previous queries, PCB data, one or more PCB rules, one or more previous PCB designs, and dispositions, where the plurality of data objects has known features, a feature identifier configured to identify one or more features in at least the current PCB design, a comparison engine, configured to compare features in the current PCB design and known features in the PCB data store that have been linked to one or more manufacturing defects, a classification engine configured to classify one or more feature between the current PCB design and the PCB data store based on a likelihood of at least one of the one or more features in the current PCB design to cause a manufacturing defect, a determination engine configured to determine one or more changes in the current PCB design likely to decrease an occurrence of the manufacturing defect, and a reporting engine configured to report the one or more changes to a user.

In some embodiments, the method and computer program product include receiving a current data object with at least a current printed circuit board (PCB) design, receiving, by a computer system, an PCB data store comprising a plurality of data objects, where the plurality of data objects comprises at least one of one or more previous queries, PCB data, one or more PCB rules, one or more previous PCB designs, and dispositions, where the plurality of data objects has known features, identifying, by a feature identifier, one or more features in at least the current PCB design, comparing, by a comparison engine, identified features in the current PCB design and known features in the PCB data store that have been linked to one or more manufacturing defects, classifying, by a classification engine, one or more feature between the current PCB design and the PCB data store based on a likelihood of at least one of the one or more features in the current PCB design to cause a manufacturing defect, determining, by a determination engine, one or more changes in the current PCB design likely to decrease an occurrence of the manufacturing defect, and reporting, by a reporting engine, the one or more changes to a user via a display logically connected to the computer system.

BRIEF DESCRIPTION OF THE DRAWINGS

The present description will be better understood from the following detailed description read in light of the accompanying drawings, wherein.

DETAILED DESCRIPTION

During the development of a printed circuit board (PCB), physical designers receive a multitude of information, requirements, rules, features likely to cause manufacturing defects, and guidelines pertaining to the specifics of the PCB design. Many of these guidelines cannot be directly input into the PCB design program. Therefore, the physical designers spend a significant amount of time reading and interpreting these guidelines; performing visual checks; and using post-design scripts to check that the information, requirements, rules, and guidelines have been incorporated in the PCB design. In an embodiment, a PCB guideline document implementation tool would be used to extract and analyze design guidelines from PCB related design documents, verify guidelines were followed in a PCB design, determine features likely to cause manufacturing defects, and/or update the design or suggest design modifications.

Figure 1:
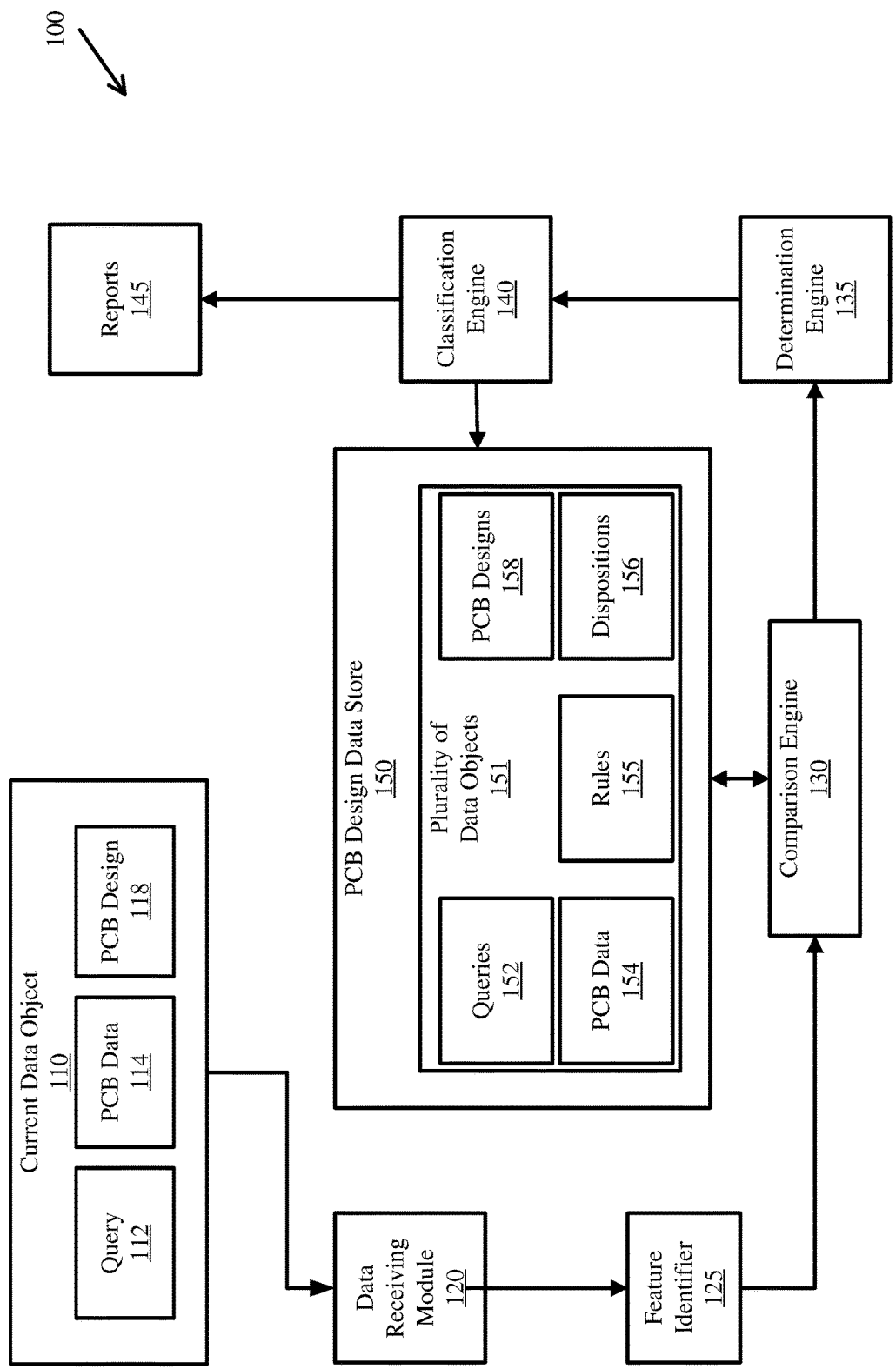
FIG. 1 is as block diagram illustrating components of a document implementation system according to one illustrative embodiment.

FIG. 1 is as block diagram illustrating components of a PCB guideline document implementation tool 100 according to one illustrative embodiment. PCB guideline document implementation tool 100 includes a current data object 110 (which may include a Query 112, PCB data 114, and/or a PCB design 118), a data receiving module 120, a feature identifier 125, a comparison engine 130, a determination engine 135, a classification engine 140, a PCB design data store 150 with a plurality of data objects 151, and a reporting engine 145. In some embodiments, the plurality of data objects 151 includes queries 152, PCB Data 154, Rules 155, PCB Designs 158, and/or dispositions 156. For example, queries 152, PCB Data 154, Rules 155, and PCB Designs 158 can be results from previous uses of tool 100 that resulted in dispositions 156 through and incorporated into PCB design data store 150 through cognitive analysis or machine learning. In some embodiments, one or more sets of information, queries 152, PCB Data 154, Rules 155, PCB Designs 158, or dispositions 156 are input into the tool. In some embodiments some information is input into the tool and other information is learnt through machine learning or cognitive analysis. In some embodiments, tool 100 uses a cloud computing environment. For example, information can be stored or accessed over a storage devices (nodes) and accessed as a storage area network (SAN). In some embodiments, PCB design data store 150 denotes any PCB information repository. In some embodiments, the data store can be or includes a database, data repositories that include unstructured data, data objects, etc. PCB guideline document implementation tool 100 may determine a category of a PCB design (e.g., bus, line-to-line spacing, impedance of a component, etc.) the feature is related to.

PCB guideline document implementation tool 100 receives a current data object 110, through data receiving module 120, that will be scored for potential design issues. In some embodiments, data receiving module 120 is configured to receive data over a network, a graphical user interface, the cloud, and/or any other means of transferring data. In some embodiments, PCB data 114 contains general PCB data such as PCB design white papers, data sheets, publications, manuals, instructional texts, general guidelines, and/or rules for classes or types of PCB designs. In some embodiments, PCB data 114 contains documents or data relating to a specific PCB Design (e.g., PCB design 118), such as emails, recorded conversations, or memos discussing the PCB design. Datasets can be merged from multiple sources to compile relevant data. In some embodiments, recorded audio information can be transcribed using natural language processing (NLP). In some embodiments, the design data consists of information selected from the group consisting of emails discussing the current PCB design, electronic messages discussing the current PCB design, transcripts of one or more audio conversations relating to the current PCB design, requirements for the current PCB design, specifications for the current PCB design, rules for the current PCB design, and combinations herein.

In some embodiments, a query 112 is included in current data object 110. In some embodiments, query 112 includes a specific parameter for PCB guideline document implementation tool 100 to check for. In some embodiments, query 112 will direct PCB guideline document implementation tool 100 to check a specific set of documents or rules, such as those included in PCB data 114, for any conflicts. In some embodiments, a query 112 is not included in current data object 110, and tool 100 will determine what factors to use based on the information in current data object 110 and/or PCB design data store 150.

In an embodiment, current data object 110 includes PCB design 118. For example, PCB design 118 can be a partially completed design, a fully completed design, or a section of a PCB. In some embodiment, designs are completed on any PCB design software. In an embodiment, current data object 110 includes design data relating to the current PCB design 118. In some embodiments, the current data object further includes one or more queries. For example, the one or more queries are provided by a user to tool 100. In an embodiment, the design data consists of information selected from the group consisting of emails discussing the current PCB design, electronic messages discussing the current PCB design, transcripts of one or more audio conversations relating to the current PCB design, requirements for the current PCB design, specifications for the current PCB design, rules for the current PCB design, and combinations herein. In some embodiments, the current data object contains design data relating to the current PCB design, and where the identifying is run on the design data and the design data is included in the PCB data store for comparison to the current PCB design.

PCB guideline document implementation tool 100 searches, using feature identifier 125, the information from the current data object 110 (typically a PCB design paired with 112 and/or and data merged from multiple sources such as PCB data 114) for specific features representative of one or more PCB design elements which together, with their structured or unstructured data attributes, are suggestive of specific PCB design elements or rules. Comparison engine 130 then compares features identified by feature identifier 125 to one or more data objects from the plurality of data objects 151. For example, the tool can have a category of peripheral component interconnect express (PCIE) bus. The tool will analyze at the actual wiring of PCB design 118 and compare the PCIE in PCB design 118 to information related to PCIE in PCB data 114 or PCB design data store 150. Examples of features can be bus requirements, line impedances, capacitor lay outs, resistance layouts, etc. In some embodiments, examples of features can also relate to violation types from different errors on PCBs. In some embodiments, implementation tool 100 will check records to for features that have been known to cause manufacturing defects. Tool 100 will identify and rank features likely to cause manufacturing defects based on manufacturing records. For example, if a certain line-to-line spacing has a manufacturing defect rate of greater than 10%, due to arcing, a larger spacing will be used. Acceptable manufacturing defect rates can be determined during the design phase and may be variable based on the component.

In some embodiments, feature identifier 125 is a component of the PCB guideline document implementation tool 100 that is configured to determine one or more features of current data object 110 for comparison. For example, feature identifier can generate at least one graph or table for one or more identified elements in current data object 110, in the current data object 110. In some embodiments, feature identifier 125 considers each data object that is presented to the PCB guideline document implementation tool 100 as well as any related data objects. In some embodiment, the feature identifier 125 takes each data object and generates a table or graph for each feature of the data object. The feature identifier 125 is configured to use cognitive learning to detect one or more patterns of entities and relations in current data object 110 which are indicative of PCB design features. In some embodiments, current data object 110 will be information to train a cognitive learning tool linked to the feature identifier 125, the comparison engine 130, and or the PCB design data store 150. For example, a user can provide tool 100 with design iterations information for a completed PCB, where the design iterations information shows the errors that each design iteration produced and how those errors were solved in subsequent iterations. Likewise, in some embodiments, tool 100 is given a manufacturing defect target rate and suggests or makes changes to a PCB design that will decrease a projected manufacturing defect rate below the target rate. In some embodiments, the identifying is run on the design data and the design data is included in the PCB data store for comparison to the current PCB design.

In an embodiment, PCB guideline document implementation tool 100 provides a framework for learning representations for features in the current data object 110. In an embodiment, the information in current data object 110 is searched for key terms or words relating to one or more feature categories. In an embodiment, in order to distinguish different types of specification types, tool 100 is trained to recognize key terms, images, etc. For example, current data object 110 can contain a table of "Electrical Specifications." For example, Table 1 lists a number of key words that can be identified in PCB data 114. Feature identifier 125 can look for acronyms, such as "PCIe," or spelled out feature names for the same component, such as "Peripheral Component Interconnect Express." Other acronyms, such as USB (universal serial bus), can be used.

TABLE 1

Exemplary key word/feature table

| Index | Keywords |
|---|---|
| 1 | PCIe |
| 2 | Peripheral Component Interconnect Express |
| 3 | USB |
| 4 | Universal Serial Bus |
| 6 | PCI-X |
| 7 | Peripheral Component Interconnect Extended |

Certain terms may have a number associated with the term. For example, "should have a line-to-line spacing of 20-30 mils. Tool 100 can register the key term "line-to-line spacing" with the numerical range 20-30 mils extracted as a requirement from PCB data 114 or PCB design data store 150. Feature identifier 125 can populate a table (for example, Table 2).

TABLE 2

Exemplary key word/feature table

| Index | Bus Type Keywords | Numerical Range |
|---|---|---|
| 1 | "Line-to-line spacing" | 20-30 mils |
| 2 | "Impedance" | 50-54 ohms |

TABLE 2-continued

Exemplary key word/feature table

| Index | Bus Type Keywords | Numerical Range |
|---|---|---|
| 3 | "Propagation delay" | 200-300 ps |
| 4 | "Skew" | <5% of clock period |

In some embodiments, multiple key words and multiple numerical ranges are associated with each other. For example, a document in PCB Data discloses that microstrip on a PCB should have an impedance value of 50-54 ohms and a height 0.1-0.2 mm. Feature identifier 125 can cross reference the impedance with the substrate height or conductor height since both factors are interdependent on each other (i.e., the height of the microstrip affects impedance value of the microstrip).

In an embodiment, tables are constructed by extracting keywords and numerical values from data extracted from the board file. In one embodiment, the keywords are extracted from PCB design 118, using a known board extraction tool, to import the physical board data into a database.

In an embodiment, comparison engine 130 cross references keywords extracted from PCB design 118 with key words in PCB data 114 or PCB design data store 150. For example, if PCB design 118 has a line-to-line spacing of 25 mils and an impedance of 75 ohms, based on the previous example, the line-to-line spacing would be within design tolerances but the impedance would not be within design tolerance. Table 3 shows a key word/feature table with both.

TABLE 3

Exemplary key word/feature table

| Index | Bus Type Keywords | Numerical Value | PCB Design |
|---|---|---|---|
| 1 | "Line-to-line spacing" | 20-30 mils | 25 mils |
| 2 | "Impedance" | 50-54 ohms | 75 ohms |
| 3 | "Propagation delay" | 200-300 ps | 300 ps |
| 4 | "Skew" | <5% of clock period | 4% of clock period |

In some embodiments, a data item, such as a table, is made to determine the likelihood of a manufacturing defect based on a variable design feature. For example, looking at Table 4, if PCB design 118 needs a predicted manufacturing defect of 5% or less due to line-line-spacing. Based on the previous example, the line-to-line spacing would need to be 20 mills or above. Table 4 shows an exemplary predicted % chance of a defect in manufacturing based on line-to-line spacing. In some embodiments, the predicted chance of defect could be for one feature, a comparison of features, or overall for a PCB based on a selection of one or more components.

TABLE 4

Exemplary key word/feature table

| Index | Bus Type Keywords | Numerical Value | Predicted % Chance of Defect |
|---|---|---|---|
| 1 | "Line-to-line spacing" | 5-10 mils | 90 |
| 2 | "Line-to-line spacing" | 10-15 mils | 60 |
| 3 | "Line-to-line spacing" | 15-20 mils | 20 |
| 4 | "Line-to-line spacing" | 20-25 mils | 5 |

In an embodiment, the comparison engine 130 tags any identified features from PCB design 118 that are not inline feature tolerances. For example, using Table 3, comparison engine 130 can tag the impedance as being outside of design tolerances.

The plurality of data objects 151, and any representative graphs or tables contained within, serve as the receptive fields to read feature values relating to PCB. In an embodiment, cognitive neural network techniques are used to identify features with feature identifier 125 compare features with comparison engine 130 and classify any discrepancies between PCB design 118 and guidelines (from PCB data 114 and PCB design data store 150) and/or identify likelihood of manufacturing defects with classification engine 140. In an embodiment, query 112 can list one or more factors for tool 100 to compare. In an embodiment, query 112 lists factors for tool 100 is directed to compare. In some embodiments, query 112 will not be given and tool 100 will determine what factors to compare based on the information in current data object 110 and PCB design data store 150. For example, tool 100 can extract that PCB design 118 has a line-to-line spacing parameter, and PCB data 114 has information on an allowable range for line spacing parameter. Thus, tool 100 will use line-to-line spacing as one factor to compare.

In some embodiments, classification engine 140 takes the information that is generated by the comparison engine 130 and determines if a particular data object (queries 152, PCB Data 154, and dispositions 156) has potential for being a discrepancy between PCB design 118 and guideline data (from PCB data 114 or PCB design data store 150) or creating a manufacturing defects during production. For example, if a line-to-line spacing from the PCB design 118 is within a line-to-line spacing range from the guideline data, classification engine 140 can classify line-to-line spacing with a low discrepancy score or likelihood of a manufacturing defect. If a line-to-line spacing from the PCB design 118 is outside a line-to-line spacing range from the guideline data, classification engine 140 can classify line-to-line spacing with a high discrepancy score or likelihood of manufacturing defects. In some embodiments, the classification engine 140 compares the score of the data object to a threshold score. If the data object exceeds a threshold score, the data object is marked as a possible positive result, e.g., a discrepancy that needs to be reported to a user. In some embodiments, a second threshold score may be present as well. The second threshold score can be a score representative of a very strong likelihood that the data object contains a positive result. If the data object exceeds the second threshold, the classification engine 140 may cause classification engine 140 to look at other related features to make sure they are within tolerances. For example, if classification engine 140 can determine that since an impedance in not within the second threshold that comparison engine 130 should check the substrate height or conductor thickness of a related microstrip. In some embodiments, the classifying is also based on a probability of each of the discrepancies to cause an error in the current PCB design or a defect in manufacturing.

In some embodiments, determination engine 135 is configured to determine changes needed to resolve one or more of the discrepancies or reduce manufacturing defects to an acceptable level. In some embodiments, PCB data 114 or one or more of the plurality of data objects 151 will be analyzed, using NLP or some other form of cognitive analysis. For example, one factor identified from the PCB data 114 can be that the current PCB design requires a USB. If there is no USB, then the determination engine 135 can determine that a USB needs to be added to the current PCB design. For example, one factor identified from the PCB design data store 150 can be that line-to-line spacing cannot be smaller than x (where x is a distance). If PCB design 118 has a line to line spacing of less than x determination engine can determine that the line-to-line spacing needs to be widened. In some embodiments, tool 100 is configured to make the changes to the current PCB design in response to the one or more discrepancies or high chance of a manufacturing defects in PCBs during production. For example, tool 100 can directly modify PCB design 118 or it can interact with a PCB design program to modify the PCB design.

In some embodiments, data objects that fall between the first and second thresholds are flagged for a user to look at in more detail and make a determination that the data object is relevant. In this way a user is able to focus on the most relevant results. In additional embodiments, the classification engine 140 may label data objects that have a score falling under a third threshold score, which is lower than the first and second threshold scores, as data objects not pertinent to the query. In some embodiments, the threshold score is related to the likelihood of a manufacturing defect in a PCB.

In some embodiments, PCB design data store 150 is a data store that houses the features of known queries, likelihood of manufacturing defects, and/or discrepancies. In some embodiments, PCB design data store 150 forms a repository for known and related PCB board designs for comparison. PCB guideline document implementation tool 100 is trained using labeled training data in the form of queries which have been performed in the past, with a user-selected "quality" label indicating which query responses contained information that was or would be considered significant and worthy of an alert. For example, this can take the form of training logs (historical logs) of activity in a PCB design tool, with automated extraction of the quality label based on whether or not there were any performance issues or problems with a particular PCB board.

For example, these known examples can have been processed in a manner similar to the current data object 110, such new examples can be created for use by the comparison engine 130 in scoring discrepancies and or likelihood of manufacturing defects. As new data objects and queries are discovered or analyzed those data objects and their corresponding features may be added to PCB design data store 150. In some embodiments, PCB design data store 150 includes data objects not relevant to associated queries, and PCB design data store 150 will have a list of one or more sets of data that do not indicate a disposition for a given query or significant result for a discrepancy. For example, the impedance of a microstrip may not be negatively affected by a material change from copper to gold.

In some embodiments, PCB guideline document implementation tool 100 uses machine learning to train tool 100 to detect discrepancies, identify isomorphisms, predict manufacturing defects, and answer questions. In an embodiment, the machine learning includes identifying patterns and associations between preexisting data (such as data contained in PCB design data store 150) and PCB design 118.

Figure 2:
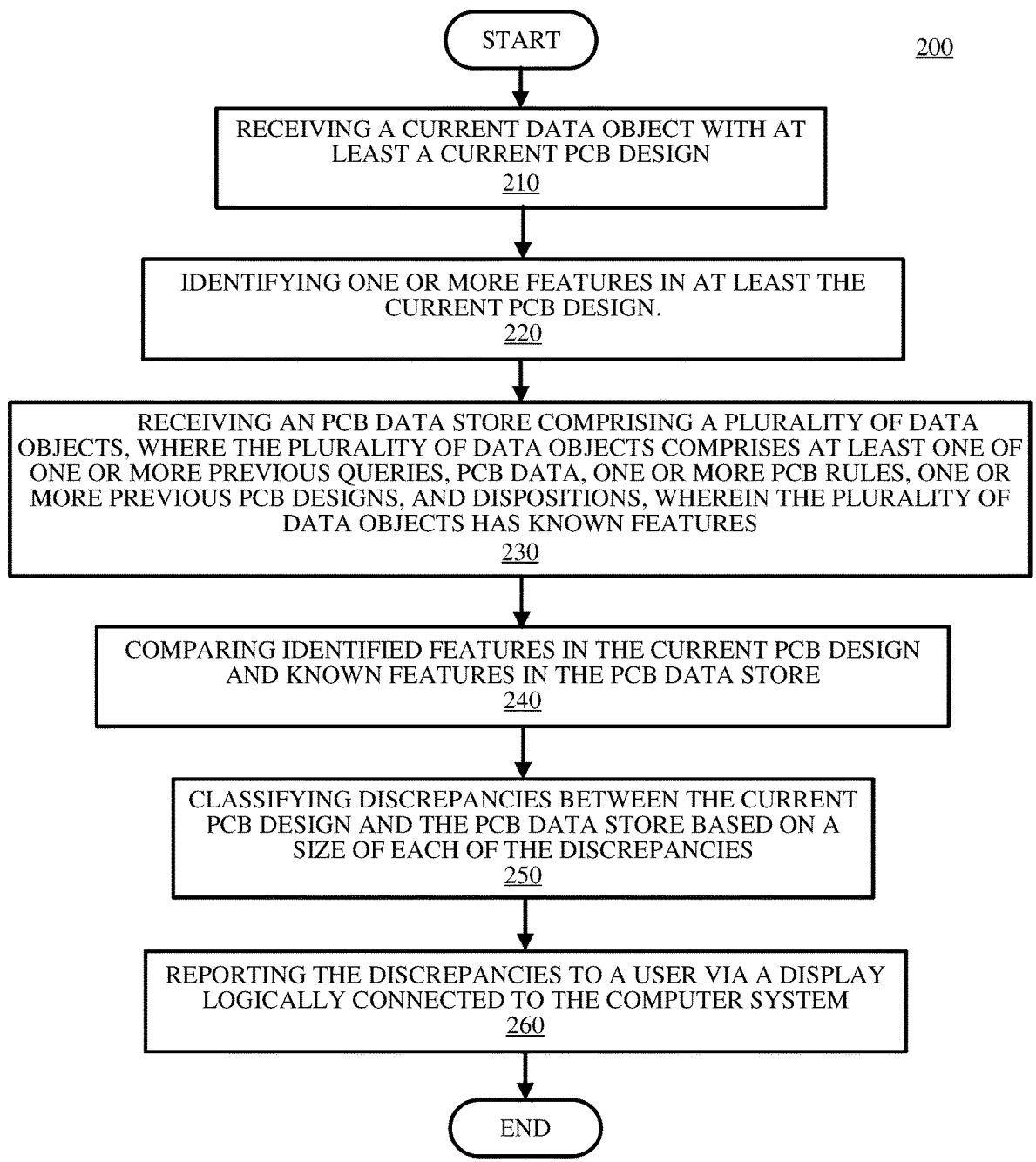
FIG. 2 is a flow diagram illustrating a process for a document implementation system according to one illustrative embodiment.

FIG. 2 is a flow diagram illustrating a process for checking PCB design with a document implementation tool according to one illustrative embodiment of the present disclosure. While this discussion is focused on examining a designed PCB, the process can also be used to check a PCB design at any stage or to gather information before creating a PCB design. Process 200 begins with the receipt of a current data object 110 by receiving module 120. In some embodiments, current data object 110 will include query 112, PCB data 114, and/or PCB design 118. This is illustrated at step 210. For example, the current data object 110 may include all data relating to PCB design 118, or it can contain links or sources for data relating to query 112. The current data object 110 may include data such as documents, spreadsheets, audio, video, social media feeds, phone records, and/or any other source of data that has information relevant to query 112 and/or PCB design 118.

Feature identifier 125 uses one or more algorithms to extract one or more patterns, features, or other data contained in current data object 110. In some embodiments, the identification uses known one or more patterns, features, or other information, such as those contained in PCB design data store 150, as a comparison to identify the one or more patterns or features from current data object 110. For example, feature identifier 125 can identify any line spacing factor that has been found to be indicative of a query before. In some embodiments, feature identifier 125 is able to identify one or more patterns or features relating to PCB design, queries, or a particular feature without baseline one or more patterns or features for comparison. For example, feature identifier 125 can use a training query (previously answered query) that identified a feature representing line-to-line spacing and search the current data object for any features representing a factor related to line-to-line spacing.

In some embodiments, the identifier is trained, via machine learning, with the training data (e.g., training data) contained in PCB design data store 150. In some embodiments, the training data include previous identification of PCB guideline document implementation tool 100. In some embodiments, the training data are drawn from other sources. For example, the training data can be PCB boards with issues or errors that were solved before the PCB boards were fully functional, where the feature identifier has processed the data object after the fact to find one or more patterns or features in the data. The identifying one or more patterns or features in the current data object is illustrated in step 220.

The tool receives PCB design data store 150. This is illustrated at step 230. For example, a plurality of data objects 151 can be received before step 220 if the data objects are used for pattern or feature identification, and/or plurality of data objects 151 can be received after step 220 for use in comparison engine 130.

Comparison engine 130 compares identified features (such as one or more patterns or features) in current data object 110 with features from the plurality of data objects 151 in PCB design data store 150. This is illustrated at step 240. For example, the tool can do this for all permutations of features identified by feature identifier 125. In some embodiments, the tool or network is trained using labeled training data in the form of queries which have been performed in the past, with a user-selected "quality" label indicating which query responses contained information that was or would be considered significant and worthy of an alert. This can take the form of logs of previous PCB errors with automated extraction of the quality label based on whether or not the results coincided with an actual PCB error.

In some embodiments, classification engine 140 determines discrepancies or likelihood of causing a manufacturing defect for each of the features in the current data object 110 and the PCB design data store 150. This is illustrated at step 250 of classifying feature/outcome correlations. For example, a discrepancy can be a correlation value (e.g., a numerical discrepancy between a value in PCB design 118 and limit for the PCB card described in PCB design data store 150) or score (e.g., likelihood to cause an error in the PCB). At step 250 the tool can employ several different approaches for scoring a feature. In one embodiment the tool identifies one or more individual features from PCB design data store 150 that are most similar to features in current data object 110. Next the tool calculates a score or classification value based on the correlation of the one or more patterns or features of the current data object to the one or more patterns or features in the one or more individual data objects from the PCB design data store 150. The weighted list may add a value to the score for a known correlation (e.g., features known to create an error), subtract a score for known dispositive correlations (e.g., features known not to create an error), and zero out scores for features not falling into either category. Additionally, the weighted score may be based on a determined ranking of the data objects based on the number of pattern or features correlations to current data object 110. For example, a line-to-line spacing known to cause an error can add +1 to the value score, a line-to-line spacing where there is no data on if it causes an error can add 0 to the value score, and a line-to-line spacing where there are examples where it functioned in a PCB without causing an error can add −1 to the value score. In some embodiments, a discrepancy is a difference between a feature in PCB design 118 and a description or value of a similar feature in PCB design data store 150 (before or after PCB data 114 is incorporated into PCB design data store 150).

In some embodiments, once the discrepancy or score (such as a likelihood to cause a manufacturing defect) has been calculated for the data objects at step 250, the potential discrepancies or scores are identified or ranked by the scores of the data objects they are associated with and provided to reporting engine 145. This is illustrated at step 260. The alert component may notify a user of the one or more ranked data objects at step 260. It may identify dispositions for each of the discrepancies or scores based on the threshold scores discussed above. For example, the disposition can be reporting a discrepancy as important or needs attention. In some embodiments, if the data object score meets or exceeds the higher threshold score, the disposition will be marked as conclusive. If it exceeds the lower threshold it may be marked as needing further evaluation. If the data object is below both thresholds it may be marked as not a possible disposition. In some embodiments, the tool may also add the current data object with the conclusive disposition to PCB design data store 150 for future use. In some embodiments, the reporting is done via a display logically connected to the processor.

Statistical analysis can be completed at steps 220, 240, and/or 250 (e.g., using kMeans or other centroid-based clustering, connectivity-based clustering, distribution-based clustering, density-based clustering, etc.) to determine features or characteristics of the sensor data. For example, the appearance of missing features in PCB, PCB components that do not conform to design rules, and the like can be frequently associated with PCB errors and can useful in identifying underlying problems with PCB design. Once identified and characterized, these features can be used to build models to identify future instances of design issues. The models may be implemented by using recursive neural networks, finite state machines, rules based on probabilistic approaches, deep learning, or other techniques. Because the models are constructed with a holistic and multi-dimensional set of data, the models can have greater ability to identify and consider previously-undiscovered or under-considered PCB issues (e.g., PCB errors, under performance, feature omission, etc.).

In some embodiments, tool 100 is able to increase the performance of a computer tool configured to design PCBs. Tool 100 optimizes design iterations by incorporating extraneous information into the design. For example, by checking the design against requirements identified from current data object 110 and PCB design data store 150 the tool is able to make sure required components are included in PCB design instead of backtracking a problem or error in a PCB design and determining what components caused the error.

In an embodiment, the tool can check for board features that are known or learned to cause manufacturing yield hits (failures in a percentage of the PCB during manufacturing) by tool 100. These issues are not usually flagged in the board design by means of normal design rules checks. In an embodiment, tool 100 can check for thru via definition to be sure the clearance lands on internal layers are the correct size when compared to the drilled via (overall pad stack definition).

In some embodiments, tool 100 streamlines the design process. Tool 100 sorts through large databases of PCB and digests the information. By prioritizing and cataloging information in PCB design data store 150 tool 100 is able to utilize large quantities of data on multiple projects where it would not be possible to sort through the large quantity of data on a case by case basis. For example, a particular PCB design may have an issue with a USB. Tool 100 may look at rules, (for example in rules 155) to determine what standard rules may apply to this application. Without tool 100 the resources would not be available to sort through all available data looking for rules relating to USBs.

Figure 3:
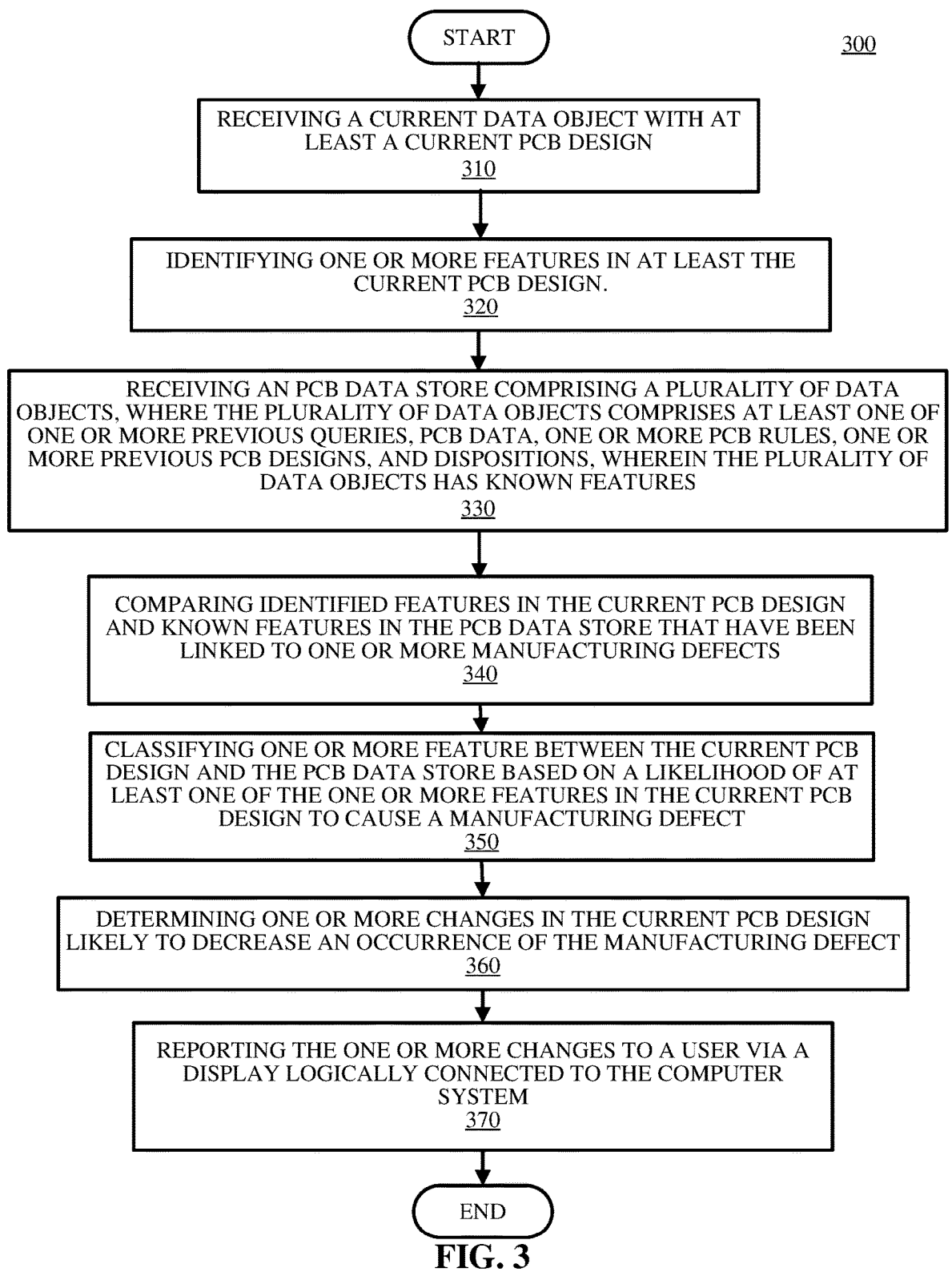
FIG. 3 is a flow diagram illustrating a process for a document implementation system according to one illustrative embodiment.

FIG. 3 is a flow diagram illustrating a process for checking PCB design with a document implementation tool according to one illustrative embodiment of the present disclosure. While this discussion is focused on examining a designed PCB, the process can also be used to check a PCB design at any stage or to gather information before creating a PCB design. Process 300 begins with the receipt of a current data object 110 by receiving module 120. In some embodiments, current data object 110 will include query 112, PCB data 114, and/or PCB design 118. This is illustrated at step 310. For example, the current data object 110 may include all data relating to PCB design 118, or it can contain links or sources for data relating to query 112. The current data object 110 may include data such as documents, spreadsheets, audio, video, social media feeds, phone records, and/or any other source of data that has information relevant to query 112 and/or PCB design 118.

Feature identifier 125 uses one or more algorithms to extract one or more patterns, features, or other data contained in current data object 110. In some embodiments, the identification uses known one or more patterns, features, or other information, such as those contained in PCB design data store 150, as a comparison to identify the one or more patterns or features from current data object 110. For example, feature identifier 125 can identify any line spacing factor that has been found to be indicative of a query before. In some embodiments, feature identifier 125 is able to identify one or more patterns or features relating to PCB design, queries, or a particular feature without baseline one or more patterns or features for comparison. For example, feature identifier 125 can use a training query (previously answered query) that identified a feature representing line-to-line spacing and search the current data object for any features representing a factor related to line-to-line spacing.

In some embodiments, the identifier is trained, via machine learning, with the training data (e.g., training data) contained in PCB design data store 150. The identifying one or more patterns or features in the current data object is illustrated in step 320. In some embodiments, the training data include previous identification of PCB guideline document implementation tool 100. In some embodiments, the training data are drawn from other sources. For example, the training data can be PCB boards with issues or errors that were solved before the PCB boards were fully functional, where the feature identifier has processed the data object after the fact to find one or more patterns or features in the data.

The tool receives PCB design data store 150. This is illustrated at step 330. For example, a plurality of data objects 151 can be received before step 320 if the data objects are used for pattern or feature identification, and/or plurality of data objects 151 can be received after step 320 for use in comparison engine 130.

Comparison engine 130 compares features (such as one or more patterns or features) in current data object 110 with features from the plurality of data objects 151 in PCB design data store 150 that have been linked to one or more manufacturing defects. This is illustrated at step 340. For example, the tool can do this for all permutations of features identified by feature identifier 125. In some embodiments, the tool or network is trained using labeled training data in the form of queries which have been performed in the past, with a user-selected "quality" label indicating which query responses contained information that was or would be considered linked to a significant risk of manufacturing defects and worthy of an alert. This can take the form of logs of previous predicted PCB manufacturing defects with automated extraction of the quality label based on whether or not the results coincided with an actual PCB manufacturing defects.

In some embodiments, classification engine 140 determines a chance or likelihood of causing a manufacturing defect for each of the features in the current data object 110 and the PCB design data store 150. This is illustrated at step 350 of classifying feature/outcome correlations. For example, a probability of a feature causing a manufacturing defect can be a correlation value (e.g., a numerical probability of a feature causing a manufacturing defect) or score (e.g., likelihood to increase the chance of a defect in manufacturing). At step 350 the tool can employ several different approaches for scoring a feature. In one embodiment the tool identifies one or more individual features from PCB design data store 150 that are most similar to features in current data object 110. Next the tool calculates a score or classification value based on the correlation of the one or more patterns or features of the current data object to the one or more patterns or features in the one or more individual data objects from the PCB design data store 150. The weighted list may add a value to the score for a known correlation (e.g., features known to increase the rate or chance of a manufacturing defects), subtract a score for known dispositive correlations (e.g., features with a low likely hood of manufacturing defect), and zero out scores for features not falling into either category. Additionally, the weighted score may be based on a determined ranking of the data objects based on the number of pattern or features correlations to current data object 110. For example, a line-to-line spacing known to cause an error can add +1 to the value score, a line-to-line spacing where there is no data on if it causes an error can add 0 to the value score, and a line-to-line spacing where there are examples where it functioned in a PCB without causing an error can add −1 to the value score. In some embodiments, a discrepancy is a difference between a feature in PCB design 118 and a description or value of a similar feature in PCB design data store 150 (before or after PCB data 114 is incorporated into PCB design data store 150).

In some embodiments, once the chance or likelihood to cause a manufacturing defect has been calculated for the data objects at step 350, a list of one or more changes to current PCB design 118 likely to decrease an occurrence of the manufacturing defect will be determined. This is illustrated at step 360. In some embodiments, a ranking of possible changes is formed into a list at 360 based on a likelihood of decreasing the chance of a manufacturing defect.

In some embodiments, once the one or more changes has been determined at step 360, the potential discrepancies or scores are identified or ranked by the scores of the data objects they are associated with and provided to reporting engine 145. This is illustrated at step 370. The alert component may notify a user of the one or more ranked data objects at step 370. In some embodiments, tool 100 identifies the likelihood to cause a manufacturing defect based on the threshold scores discussed above.

Statistical analysis can be completed at steps 320, 340, and/or 350 (e.g., using kMeans or other centroid-based clustering, connectivity-based clustering, distribution-based clustering, density-based clustering, etc.) to determine features or characteristics of the sensor data. For example, the appearance of missing features in PCB, PCB components that do not conform to design rules, and the like can be frequently associated with PCB errors and can useful in identifying underlying problems with PCB design. Once identified and characterized, these features can be used to build models to identify future instances of design issues. The models may be implemented by using recursive neural networks, finite state machines, rules based on probabilistic approaches, deep learning, or other techniques. Because the models are constructed with a holistic and multi-dimensional set of data, the models can have greater ability to identify and consider previously-undiscovered or under-considered PCB issues (e.g., PCB errors, under performance, feature omission, etc.).

Figure 4:
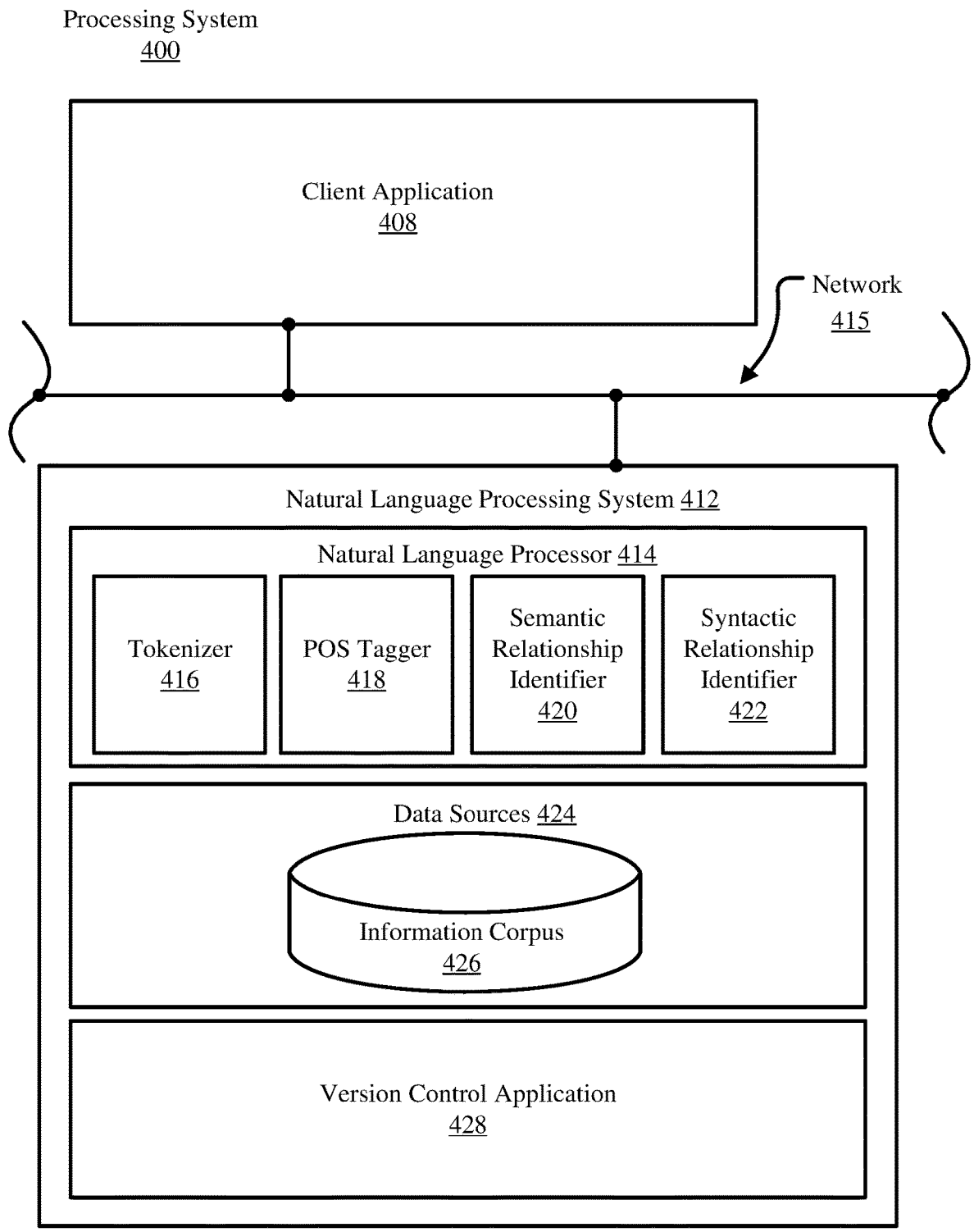
FIG. 4 is a block diagram illustrating a natural language processing system configured to process unstructured data inputs, in accordance with embodiments of the present disclosure.

Turning now to FIG. 4, illustrated is a block diagram of an example natural language processing tool 400 configured to process unstructured data inputs (e.g., unstructured text documents), in accordance with embodiments of the present disclosure. In some embodiments, a remote device can submit input data, through data receiving module 120 to be analyzed by the natural language processing tool 412, which can be a standalone device, or part of a larger computer tool. Such a processing tool 400 can include a client application 408, which can itself involve one or more entities operable to generate or modify unstructured input data that is then dispatched to a natural language processing tool 412 via a network 415. In some embodiments, identifying further comprises using natural language processing to identify features.

Consistent with various embodiments, the natural language processing system 412 can respond to electronic document submissions sent by the client application 408 (e.g., feature identifier 125 of FIG. 1). Specifically, the natural language processing system 412 can analyze a received unstructured data input (e.g., PCB data 114, query 112, or data in the PCB design data store) and prepare the unstructured data input for comparison to other data. The natural language processing system 412 includes a natural language processor 414, data sources 424, and a version control application 428.

The natural language processor 414 (e.g., natural language processor 170 of FIG. 1) can be a computer module that analyzes the received unstructured input data from data sources 424. The data sources 424 can be the same or substantially similar to the current data object 110 and/or PCB design data store 150 described in FIG. 1. In some embodiments, the data sources 424 can include an information corpus 426. The information corpus 426 can enable data storage and retrieval. In some embodiments, the information corpus 426 may be a storage mechanism that houses a standardized, consistent, clean, and integrated list of data, such as chat history data and/or version control history data that has been arranged subject to data quality or data hygiene systems or rules.

The natural language processor 414 can perform various methods and techniques for analyzing electronic documents (e.g., syntactic analysis, semantic analysis, personal name recognition, etc.). The natural language processor 414 can be configured to recognize and analyze any number of natural languages. In some embodiments, the natural language processor 414 can parse passages of the documents (e.g., chat logs, emails, transcribed conversations, and/or source code files). Further, the natural language processor 414 can include various modules to perform analyses of electronic documents. These modules can include, but are not limited to, a tokenizer 416, a part-of-speech (POS) tagger 418, a semantic relationship identifier 420, and a syntactic relationship identifier 422.

In some embodiments, the tokenizer 416 can be a computer module that performs lexical analysis. The tokenizer 416 can convert a sequence of characters into a sequence of tokens. A token can be a string of characters included in an electronic input document and categorized as a meaningful symbol. Further, in some embodiments, the tokenizer 416 can identify word boundaries in an electronic document and can break any text passages within the document into their component text elements, such as words, multiword tokens, numbers, and punctuation marks. In some embodiments, the tokenizer 416 can receive a string of characters, identify the lexemes in the string, and categorize them into tokens.

Consistent with various embodiments, the POS tagger 418 can be a computer module that marks up a word in passages to correspond to a particular part of speech. The POS tagger 418 can ingest a passage or other text in natural language and assign a part of speech to each word or other token. The POS tagger 418 can determine the part of speech to which a word (or other text element) corresponds, based on the definition of the word and the context of the word. The context of a word can be based on its relationship with adjacent and related words in a phrase, sentence, or paragraph. In some embodiments, the context of a word can be dependent on one or more previously analyzed data inputs (e.g., the context of a word in a dictionary can describe or bring further meaning to a word or phrase in an encyclopedia). In embodiments, the output of the natural language processing system 412 can populate a text index, a triplestore, or a relational database (RDB) to enhance the contextual interpretation of a word or term. Examples of parts of speech that can be assigned to words include, but are not limited to, nouns, verbs, adjectives, adverbs, and the like. Examples of other part of speech categories that POS tagger 418 can assign include, but are not limited to, comparative or superlative adverbs, wh-adverbs, conjunctions, determiners, negative particles, possessive markers, prepositions, wh-pronouns, and the like. In some embodiments, the POS tagger 418 can tag or otherwise annotate tokens of a passage with part of speech categories. In some embodiments, the POS tagger 418 can tag tokens or words of a passage to be parsed by the natural language processing system 412.

In some embodiments, the semantic relationship identifier 420 can be a computer module that can be configured to identify semantic relationships of recognized text elements (e.g., words, phrases) in documents. In some embodiments, the semantic relationship identifier 420 can determine functional dependencies between entities and other semantic relationships.

Consistent with various embodiments, the syntactic relationship identifier 422 can be a computer module that can be configured to identify syntactic relationships in a passage composed of tokens. The syntactic relationship identifier 422 can determine the grammatical structure of sentences such as, for example, which groups of words are associated as phrases and which word is the subject or object of a verb. The syntactic relationship identifier 422 can conform to formal grammar.

In some embodiments, the natural language processor 414 can include a personal name recognition component that can search, analyze, and compare multicultural name data sets by applying culture-specific name data and linguistic rules that are associated with the name's culture. The name recognition component can ingest tokenized text data or recognized text elements, can recognize potential personal names and parse them into surname and given name components, and can generate variations of personal names, including common or user-suggested nicknames, for comparison. The name recognition component can match names based on both pronunciation and orthography, associating the closeness of the matches with scores. Thus, the name recognition component can compare monikers or other identifiers associated with users of the version control application 428 with personal names that appear in the chat history, for fuzzy personal name comparison.

In some embodiments, the natural language processor 414 can be a computer module that can parse a document and generate corresponding data structures for one or more portions of the document. For example, in response to receiving an unstructured textual report at the natural language processing system 412, the natural language processor 414 can output parsed text elements from the report as data structures. In some embodiments, a parsed text element can be represented in the form of a parse tree or other graph structure. To generate the parsed text element, the natural language processor 414 can trigger computer modules 416-422.

The output of natural language processor 414 can be used to associate chat history data with source code files via the version control application 428. For example, if a source code file is processed by the natural language processing system 412, the processed source code file can be compared to chat history data (e.g., which may also be processed by the natural language processor 414) by the version control application 428. This can allow matching (e.g., fuzzy name matching) between the source code files and the chat history. The comparison can include comparing characters, tokens, semantic relationships, and syntactic relationships between the processed data. The comparison can accommodate conventions used in the software development community, such as the camel-casing of compound names of functions, variables, and the like in lieu of incorporating spaces in the names. The comparison can consider camel-cased names comprising compounded multiple terms as equivalent, or approximately equivalent, to the multiple terms themselves, or to a phrase comprising the multiple terms. Based on the comparison, a statistical analyzer of the version control application 428 can determine a match certainty. The match certainty can depend on the number of "hits" for characters, parts of speech, tokens, identified relationships, features (e.g., timings, user names, product names, code functions, methods, objects, object classes, or any other data included in source code files) and the like between the chat history data and source code revision data. In some embodiments, the match certainty can be quantified by a numerical range (e.g., 1-10) or percentage (e.g., 0-100%) or probability (e.g. 0.01-0.99) or other score. In these embodiments, storing the association between the chat history and the source code data may be completed in response to the match certainty satisfying a predetermined threshold. For example, if a match certainty threshold is defined as 70%, the association is stored only if the match certainty satisfies the 70% threshold (e.g., equal to or exceeding 70% match certainty). In some embodiments, a user can indicate portions of chat history and/or source code to be analyzed by the natural language processor 414, to narrow the amount of data processed by the natural language processor 414. In an embodiment, the one or more features includes a code sequence, where the comparing includes comparing the code sequence of the identified features of the current PCB to a code sequence of the identified features in the plurality of data objects, where a match certainty is determined to satisfy a match certainty threshold in response to the code sequence of the identified features of the current PCB matching the code sequence of the features in the plurality of data objects.

In some embodiments, the portions of chat history and/or artifact to be analyzed can be determined based on the time elapsed between check-in of artifacts, or between the time associated with particular chat content and the time associated with a particular check-in, beyond which the chat content may not be considered potentially related to the check-in.

Computer System

Figure 5:
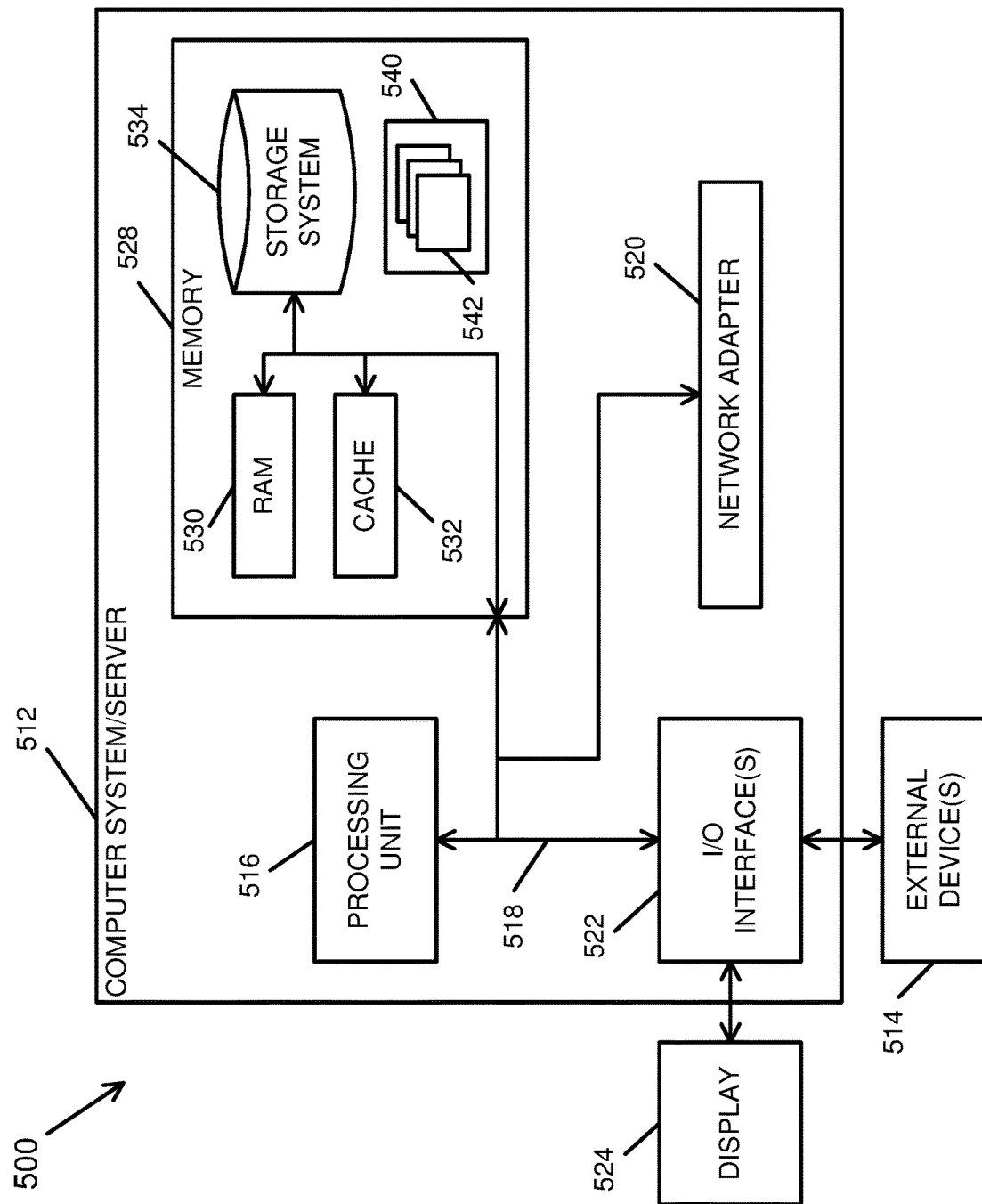
FIG. 5 depicts a computer system in accordance with an exemplary embodiment of the present disclosure.

In an exemplary embodiment, the computer system is a computer system 500 as shown in FIG. 5. Computer system 500 is only one example of a computer system and is not intended to suggest any limitation as to the scope of use or functionality of embodiments of the present disclosure. Regardless, computer system 500 is capable of being implemented to perform and/or performing any of the functionality/steps of the present disclosure.

Computer system 500 includes a computer system/server 512, which is operational with numerous other general purpose or special purpose computing system environments or configurations. Examples of well-known computing systems, environments, and/or configurations that may be suitable for use with computer system/server 512 include, but are not limited to, personal computer systems, server computer systems, thin clients, thick clients, hand-held or laptop devices, multiprocessor systems, microprocessor-based systems, set top boxes, programmable consumer electronics, network PCs, minicomputer systems, mainframe computer systems, and distributed cloud computing environments that include any of the above systems or devices.

Computer system/server 512 may be described in the general context of computer system-executable instructions, such as program modules, being executed by a computer system. Generally, program modules may include routines, programs, objects, components, logic, and/or data structures that perform particular tasks or implement particular abstract data types. Computer system/server 512 may be practiced in distributed cloud computing environments where tasks are performed by remote processing devices that are linked through a communications network. In a distributed cloud computing environment, program modules may be located in both local and remote computer system storage media including memory storage devices.

Referring to FIG. 5, computer system/server 512 in computer system 500 is shown in the form of a general-purpose computing device. The components of computer system/server 512 may include, but are not limited to, one or more processors or processing units 516, a system memory 528, and a bus 518 that couples various system components including system memory 528 to processor 516.

Bus 518 represents one or more of any of several types of bus structures, including a memory bus or memory controller, a peripheral bus, an accelerated graphics port, and a processor or local bus using any of a variety of bus architectures. By way of example, and not limitation, such architectures include Industry Standard Architecture (ISA) bus, Micro Channel Architecture (MCA) bus, Enhanced ISA (EISA) bus, Video Electronics Standards Association (VESA) local bus, and Peripheral Component Interconnects (PCI) bus.

Computer system/server 512 typically includes a variety of computer system readable media. Such media may be any available media that is accessible by computer system/server 512, and includes both volatile and non-volatile media, removable and non-removable media.

System memory 528 can include computer system readable media in the form of volatile memory, such as random access memory (RAM) 530 and/or cache memory 532. Computer system/server 512 may further include other removable/non-removable, volatile/non-volatile computer system storage media. By way of example only, storage system 534 can be provided for reading from and writing to a non-removable, non-volatile magnetic media (not shown and typically called a "hard drive"). Although not shown, a magnetic disk drive for reading from and writing to a removable, non-volatile magnetic disk (e.g., a "floppy disk"), and an optical disk drive for reading from or writing to a removable, non-volatile optical disk such as a CD-ROM, DVD-ROM or other optical media can be provided. In such instances, each can be connected to bus 518 by one or more data media interfaces. As will be further depicted and described below, memory 528 may include at least one program product having a set (e.g., at least one) of program modules that are configured to carry out the functions/steps of embodiments of the disclosure.

Program/utility 540, having a set (at least one) of program modules 542, may be stored in memory 528 by way of example, and not limitation. Exemplary program modules 542 may include an operating system, one or more application programs, other program modules, and program data. Each of the operating system, one or more application programs, other program modules, and program data or some combination thereof, may include an implementation of a networking environment. Program modules 542 generally carry out the functions and/or methodologies of embodiments of the present disclosure.

Computer system/server 512 may also communicate with one or more external devices 514 such as a keyboard, a pointing device, a display 524, one or more devices that enable a user to interact with computer system/server 512, and/or any devices (e.g., network card, modem, etc.) that enable computer system/server 512 to communicate with one or more other computing devices. Such communication can occur via Input/Output (I/O) interfaces 522. Still yet, computer system/server 512 can communicate with one or more networks such as a local area network (LAN), a general wide area network (WAN), and/or a public network (e.g., the Internet) via network adapter 520. As depicted, network adapter 520 communicates with the other components of computer system/server 512 via bus 518. It should be understood that although not shown, other hardware and/or software components can be used in conjunction with computer system/server 512. Examples, include, but are not limited to: microcode, device drivers, redundant processing units, external disk drive arrays, RAID systems, tape drives, and data archival storage systems.

Cloud Computing

It is understood in advance that although this disclosure includes a detailed description on cloud computing, implementation of the teachings recited herein are not limited to a cloud computing environment. Rather, embodiments of the present disclosure are capable of being implemented in conjunction with any other type of computing environment now known or later developed.

Cloud computing is a model of service delivery for enabling convenient, on-demand network access to a shared pool of configurable computing resources (e.g. networks, network bandwidth, servers, processing, memory, storage, applications, virtual machines, and services) that can be rapidly provisioned and released with minimal management effort or interaction with a provider of the service. This cloud model may include at least five characteristics, at least three service models, and at least four deployment models.

Characteristics are as follows:

On-demand self-service: a cloud consumer can unilaterally provision computing capabilities, such as server time and network storage, as needed automatically without requiring human interaction with the service's provider.

Broad network access: capabilities are available over a network and accessed through standard mechanisms that promote use by heterogeneous thin or thick client platforms (e.g., mobile phones, laptops, and PDAs).

Resource pooling: the provider's computing resources are pooled to serve multiple consumers using a multi-tenant model, with different physical and virtual resources dynamically assigned and reassigned according to demand. There is a sense of location independence in that the consumer generally has no control or knowledge over the exact location of the provided resources but may be able to specify location at a higher level of abstraction (e.g., country, state, or datacenter).

Rapid elasticity: capabilities can be rapidly and elastically provisioned, in some cases automatically, to quickly scale out and rapidly released to quickly scale in. To the consumer, the capabilities available for provisioning often appear to be unlimited and can be purchased in any quantity at any time.

Measured service: cloud systems automatically control and optimize resource use by leveraging a metering capability at some level of abstraction appropriate to the type of service (e.g., storage, processing, bandwidth, and active user accounts). Resource usage can be monitored, controlled, and reported providing transparency for both the provider and consumer of the utilized service.

Service Models are as follows:

Software as a Service (SaaS): the capability provided to the consumer is to use the provider's applications running on a cloud infrastructure. The applications are accessible from various client devices through a thin client interface such as a web browser (e.g., web-based e-mail). The consumer does not manage or control the underlying cloud infrastructure including network, servers, operating systems, storage, or even individual application capabilities, with the possible exception of limited user-specific application configuration settings.

Platform as a Service (PaaS): the capability provided to the consumer is to deploy onto the cloud infrastructure consumer-created or acquired applications created using programming languages and tools supported by the provider. The consumer does not manage or control the underlying cloud infrastructure including networks, servers, operating systems, or storage, but has control over the deployed applications and possibly application hosting environment configurations.

Infrastructure as a Service (IaaS): the capability provided to the consumer is to provision processing, storage, networks, and other fundamental computing resources where the consumer is able to deploy and run arbitrary software, which can include operating systems and applications. The consumer does not manage or control the underlying cloud infrastructure but has control over operating systems, storage, deployed applications, and possibly limited control of select networking components (e.g., host firewalls).

Deployment Models are as follows:

Private cloud: the cloud infrastructure is operated solely for an organization. It may be managed by the organization or a third party and may exist on-premises or off-premises.

Community cloud: the cloud infrastructure is shared by several organizations and supports a specific community that has shared concerns (e.g., mission, security requirements, policy, and compliance considerations). It may be managed by the organizations or a third party and may exist on-premises or off-premises.

Public cloud: the cloud infrastructure is made available to the general public or a large industry group and is owned by an organization selling cloud services.

Hybrid cloud: the cloud infrastructure is a composition of two or more clouds (private, community, or public) that remain unique entities but are bound together by standardized or proprietary technology that enables data and application portability (e.g., cloud bursting for load-balancing between clouds).

A cloud computing environment is service oriented with a focus on statelessness, low coupling, modularity, and semantic interoperability. At the heart of cloud computing is an infrastructure comprising a network of interconnected nodes.

Figure 6:
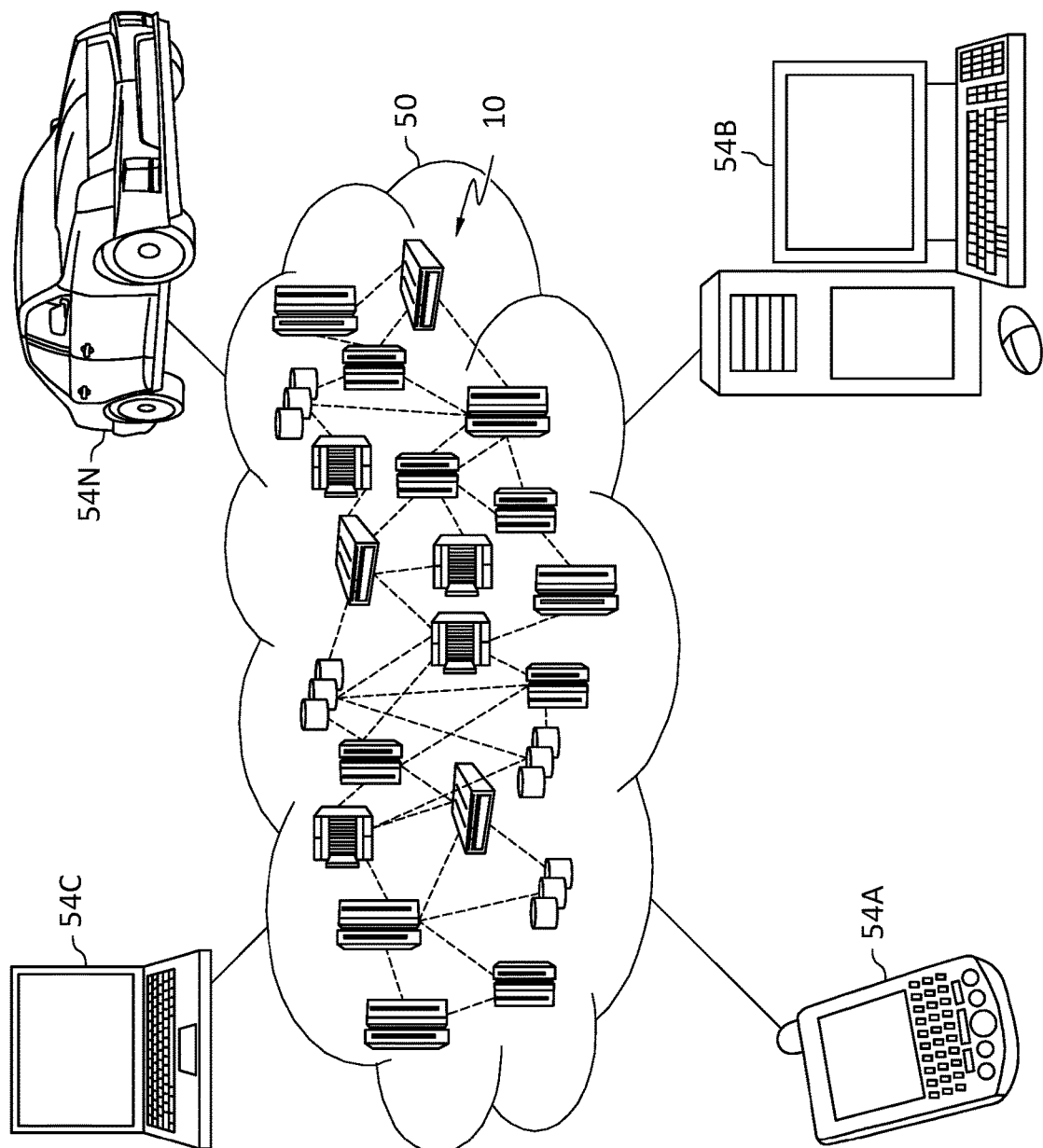
FIG. 6 depicts a cloud computing environment according to various embodiments of the present disclosure.

Referring now to FIG. 6, illustrative cloud computing environment 50 is depicted. As shown, cloud computing environment 50 includes one or more cloud computing nodes 10 with which local computing devices used by cloud consumers, such as, for example, personal digital assistant (PDA) or cellular telephone 54A, desktop computer 54B, laptop computer 54C, and/or automobile computer system 54N may communicate. Nodes 10 may communicate with one another. They may be grouped (not shown) physically or virtually, in one or more networks, such as Private, Community, Public, or Hybrid clouds as described hereinabove, or a combination thereof. This allows cloud computing environment 50 to offer infrastructure, platforms and/or software as services for which a cloud consumer does not need to maintain resources on a local computing device. It is understood that the types of computing devices 54A-N shown in FIG. 5 are intended to be illustrative only and that computing nodes 10 and cloud computing environment 50 can communicate with any type of computerized device over any type of network and/or network addressable connection (e.g., using a web browser).

Figure 7:
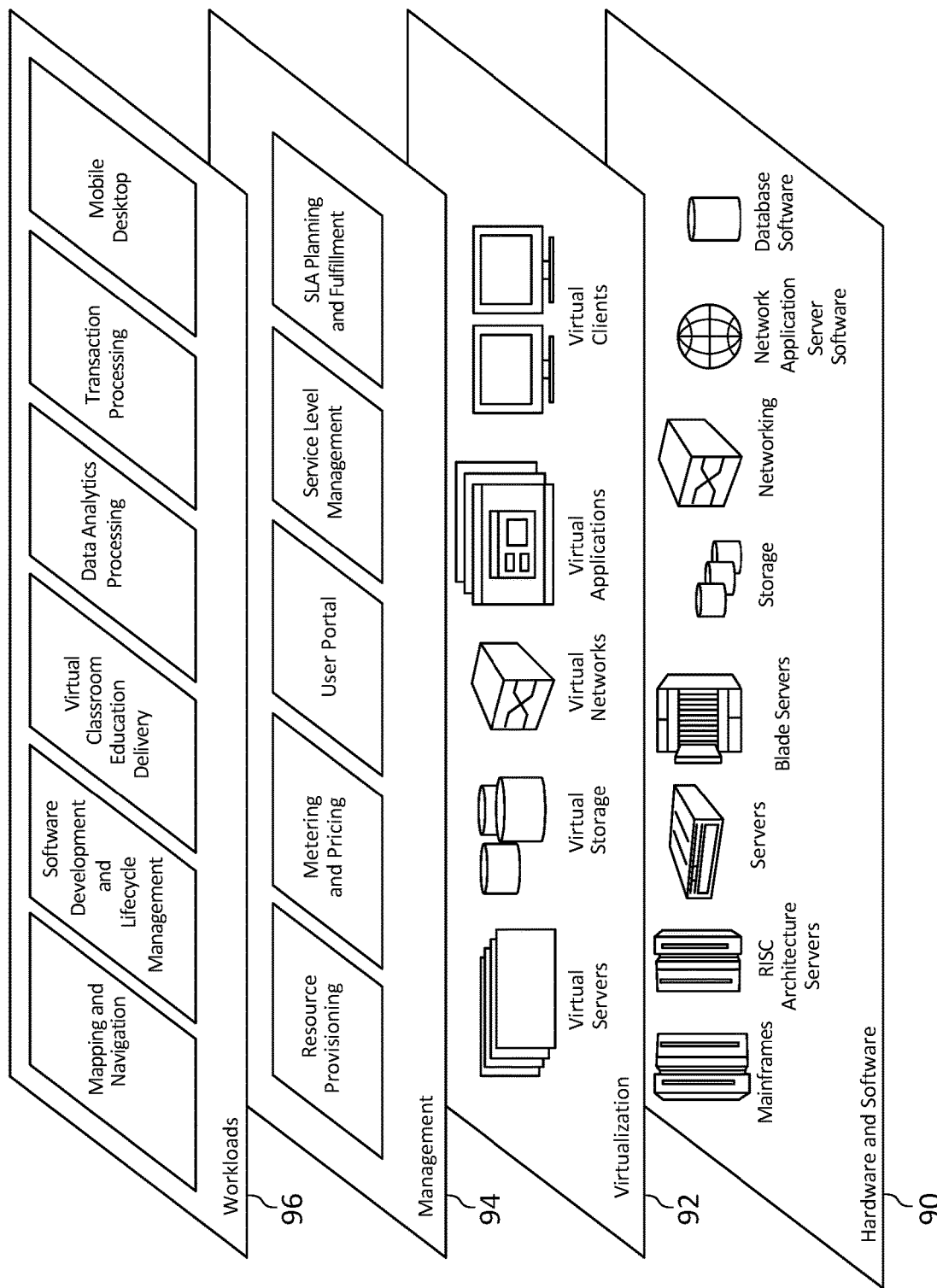
FIG. 7 depicts abstraction model layers according to various embodiments of the present disclosure.

Referring now to FIG. 7, a set of functional abstraction layers provided by cloud computing environment 60 (FIG. 6) is shown. It should be understood in advance that the components, layers, and functions shown in FIG. 7 are intended to be illustrative only and embodiments of the disclosure are not limited thereto. As depicted, the following layers and corresponding functions are provided:

Hardware and software layer 90 includes hardware and software components. Examples of hardware components include: mainframes; RISC (Reduced Instruction Set Computer) architecture based servers; storage devices; networks and networking components. In some embodiments, software components include network application server software.

Virtualization layer 92 provides an abstraction layer from which the following examples of virtual entities may be provided: virtual servers; virtual storage; virtual networks, including virtual private networks; virtual applications and operating systems; and virtual clients.

In one example, management layer 94 may provide the functions described below. Resource provisioning provides dynamic procurement of computing resources and other resources that are utilized to perform tasks within the cloud computing environment. Metering and Pricing provide cost tracking as resources are utilized within the cloud computing environment, and billing or invoicing for consumption of these resources. In one example, these resources may include application software licenses. Security provides identity verification for cloud consumers and tasks, as well as protection for data and other resources. User portal provides access to the cloud computing environment for consumers and system administrators. Service level management provides cloud computing resource allocation and management such that required service levels are met. Service Level Agreement (SLA) planning and fulfillment provide pre-arrangement for, and procurement of, cloud computing resources for which a future requirement is anticipated in accordance with an SLA.

Workloads layer 96 provides examples of functionality for which the cloud computing environment may be utilized. Examples of workloads and functions which may be provided from this layer include: mapping and navigation; software development and lifecycle management; virtual classroom education delivery; data analytics processing; transaction processing; and mobile desktop.

Computer Program Product

The present disclosure may be a system, a method, and/or a computer program product. The computer program product may include a computer readable storage medium (or media) having computer readable program instructions thereon for causing a processor to carry out aspects of the present disclosure.

The computer readable storage medium can be a tangible device that can retain and store instructions for use by an instruction execution device. The computer readable storage medium may be, for example, but is not limited to, an electronic storage device, a magnetic storage device, an optical storage device, an electromagnetic storage device, a semiconductor storage device, or any suitable combination of the foregoing. A non-exhaustive list of more specific examples of the computer readable storage medium includes the following: a portable computer diskette, a hard disk, a random access memory (RAM), a read-only memory (ROM), an erasable programmable read-only memory (EPROM or Flash memory), a static random access memory (SRAM), a portable compact disc read-only memory (CD-ROM), a digital versatile disk (DVD), a memory stick, a floppy disk, a mechanically encoded device such as punch-cards or raised structures in a groove having instructions recorded thereon, and any suitable combination of the foregoing. A computer readable storage medium, as used herein, is not to be construed as being transitory signals per se, such as radio waves or other freely propagating electromagnetic waves, electromagnetic waves propagating through a waveguide or other transmission media (e.g., light pulses passing through a fiber-optic cable), or electrical signals transmitted through a wire.

Computer readable program instructions described herein can be downloaded to respective computing/processing devices from a computer readable storage medium or to an external computer or external storage device via a network, for example, the Internet, a local area network, a wide area network and/or a wireless network. The network may comprise copper transmission cables, optical transmission fibers, wireless transmission, routers, firewalls, switches, gateway computers and/or edge servers. A network adapter card or network interface in each computing/processing device receives computer readable program instructions from the network and forwards the computer readable program instructions for storage in a computer readable storage medium within the respective computing/processing device.

Computer readable program instructions for carrying out operations of the present disclosure may be assembler instructions, instruction-set-architecture (ISA) instructions, machine instructions, machine dependent instructions, microcode, firmware instructions, state-setting data, or either source code or object code written in any combination of one or more programming languages, including an object oriented programming language such as Smalltalk, C++ or the like, and conventional procedural programming languages, such as the "C" programming language or similar programming languages. The computer readable program instructions may execute entirely on the user's computer, partly on the user's computer, as a stand-alone software package, partly on the user's computer and partly on a remote computer or entirely on the remote computer or server. In the latter scenario, the remote computer may be connected to the user's computer through any type of network, including a local area network (LAN) or a wide area network (WAN), or the connection may be made to an external computer (for example, through the Internet using an Internet Service Provider). In some embodiments, electronic circuitry including, for example, programmable logic circuitry, field-programmable gate arrays (FPGA), or programmable logic arrays (PLA) may execute the computer readable program instructions by utilizing state information of the computer readable program instructions to personalize the electronic circuitry, in order to perform aspects of the present disclosure.

Aspects of the present disclosure are described herein with reference to flowchart illustrations and/or block diagrams of methods, apparatus (systems), and computer program products according to embodiments of the disclosure. It will be understood that each block of the flowchart illustrations and/or block diagrams, and combinations of blocks in the flowchart illustrations and/or block diagrams, can be implemented by computer readable program instructions.

These computer readable program instructions may be provided to a processor of a general purpose computer, special purpose computer, or other programmable data processing apparatus to produce a machine, such that the instructions, which execute via the processor of the computer or other programmable data processing apparatus, create means for implementing the functions/acts specified in the flowchart and/or block diagram block or blocks. These computer readable program instructions may also be stored in a computer readable storage medium that can direct a computer, a programmable data processing apparatus, and/or other devices to function in a particular manner, such that the computer readable storage medium having instructions stored therein comprises an article of manufacture including instructions which implement aspects of the function/act specified in the flowchart and/or block diagram block or blocks.

The computer readable program instructions may also be loaded onto a computer, other programmable data processing apparatus, or other device to cause a series of operational steps to be performed on the computer, other programmable apparatus or other device to produce a computer implemented process, such that the instructions which execute on the computer, other programmable apparatus, or other device implement the functions/acts specified in the flowchart and/or block diagram block or blocks.

The flowchart and block diagrams in the figures illustrate the architecture, functionality, and operation of possible implementations of systems, methods, and computer program products according to various embodiments of the present disclosure. In this regard, each block in the flowchart or block diagrams may represent a module, segment, or portion of instructions, which comprises one or more executable instructions for implementing the specified logical function(s). In some alternative implementations, the functions noted in the block may occur out of the order noted in the figures. For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts or carry out combinations of special purpose hardware and computer instructions.

The descriptions of the various embodiments of the present disclosure have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to explain the principles of the embodiments, the practical application or technical improvement over technologies found in the marketplace, or to enable others of ordinary skill in the art to understand the embodiments disclosed herein.

"Present disclosure" does not create an absolute indication and/or implication that the described subject matter is covered by the initial set of claims, as filed, by any as-amended set of claims drafted during prosecution, and/or by the final set of claims allowed through patent prosecution and included in the issued patent. The term "present disclosure" is used to assist in indicating a portion or multiple portions of the disclosure that might possibly include an advancement or multiple advancements over the state of the art. This understanding of the term "present disclosure" and the indications and/or implications thereof are tentative and provisional and are subject to change during the course of patent prosecution as relevant information is developed and as the claims may be amended.

"And/or" is the inclusive disjunction, also known as the logical disjunction and commonly known as the "inclusive or." For example, the phrase "A, B, and/or C," means that at least one of A or B or C is true; and "A, B, and/or C" is only false if each of A and B and C is false.

The invention claimed is:

1. A system comprising:
   at least one processor;
   a current data object with at least a current printed circuit board (PCB) design;
   a PCB data store comprising a plurality of data objects, wherein the plurality of data objects comprises at least one of one or more previous queries, PCB data, one or more PCB rules, one or more previous PCB designs, and dispositions,
   wherein the plurality of data objects has known features;
   a feature identifier configured to identify one or more features in at least the current PCB design;
   a comparison engine, configured to compare features in the current PCB design and known features in the PCB data store;
   a classification engine configured to classify one or more discrepancies between the current PCB design and a guideline for the PCB design from the PCB data store based on a size of each of the one or more discrepancies;
   a determination engine configured to determine changes needed to resolve the one or more discrepancies; and
   a reporting engine configured to report the one or more discrepancies to a user.

2. The system of claim 1,
   wherein the current data object contains design data relating to the current PCB design; and
   wherein the identifying is run on the design data and the design data is included in the PCB data store for comparison to the current PCB design.

3. The system of claim 2, wherein the reporting engine is further configured to make the changes to the current PCB design in response to the one or more discrepancies.

4. The system of claim 3, wherein the design data consists of information selected from the group consisting of emails discussing the current PCB design, electronic messages discussing the current PCB design, transcripts of one or more audio conversations relating to the current PCB design, requirements for the current PCB design, specifications for the current PCB design, rules for the current PCB design, and combinations herein.

5. The system of claim 1, wherein the classifying is also based on a probability of each of the one or more discrepancies to cause an error in the current PCB design.

6. The system of claim 1, wherein the current data object further includes one or more queries.

7. The system of claim 6, wherein the one or more queries are provided by a user.

8. The system of claim 1, wherein the identifying further comprises using natural language processing to identify features.

9. The system of claim 1, wherein one or more features includes a code sequence, wherein the comparing includes comparing the code sequence of the identified features of the current PCB to a code sequence of the identified features in the plurality of data objects, wherein a match certainty is determined to satisfy a match certainty threshold in response to the code sequence of the identified features of the current PCB matching the code sequence of the features in the plurality of data objects.

10. A method comprising:
    receiving a current data object with at least a current printed circuit board (PCB) design;
    receiving, by a computer system, an PCB data store comprising a plurality of data objects, wherein the plurality of data objects comprises at least one of one or more previous queries, PCB data, one or more PCB rules, one or more previous PCB designs, and dispositions,
    wherein the plurality of data objects has known features;
    identifying, by a feature identifier, one or more features in at least the current PCB design;
    comparing, by a comparison engine, identified features in the current PCB design and known features in the PCB data store;
    classifying, by a classification engine, one or more discrepancies between the current PCB design and a guideline for the PCB design from the PCB data store based on a size of each of the one or more discrepancies;
    determining, by a determination engine, changes needed to resolve the one or more discrepancies; and
    reporting, by a reporting engine, the one or more discrepancies to a user via a display logically connected to the computer system.

11. The method of claim 10,
    wherein the current data object contains design data relating to the current PCB design; and
    wherein the identifying is run on the design data and the design data is included in the PCB data store for comparison to the current PCB design.

12. The method of claim 11, wherein the reporting engine is further configured to make the changes to the current PCB design in response to the one or more discrepancies.

13. The method of claim 12, wherein the design data consists of information selected from the group consisting of emails discussing the current PCB design, electronic messages discussing the current PCB design, transcripts of one or more audio conversations relating to the current PCB design, requirements for the current PCB design, specifications for the current PCB design, rules for the current PCB design, and combinations herein.

14. The method of claim 10, wherein the classifying is also based on a probability of each of the one or more discrepancies to cause an error in the current PCB design.

15. The method of claim 10, wherein the current data object further includes one or more queries.

16. The method of claim 10, wherein the identifying further comprises using natural language processing to identify features.

17. The method of claim 10, wherein one or more features includes a code sequence, wherein the comparing includes comparing the code sequence of the identified features of the current PCB to a code sequence of the identified features in the plurality of data objects, wherein a match certainty is determined to satisfy a match certainty threshold in response to the code sequence of the identified features of the current PCB matching the code sequence of the features in the plurality of data objects.

18. A computer program product comprising a computer readable storage medium having program instructions embodied therewith, the program instructions executable by a processor to cause the processor to perform a method comprising:
    receiving a current data object with at least a current printed circuit board (PCB) design;
    receiving, by a computer system, an PCB data store comprising a plurality of data objects, wherein the plurality of data objects comprises at least one of one or more previous queries, PCB data, one or more PCB rules, one or more previous PCB designs, and dispositions, wherein the plurality of data objects has known features;

identifying, by a feature identifier, one or more features in at least the current PCB design;

comparing, by a comparison engine, identified features in the current PCB design and known features in the PCB data store;

classifying, by a classification engine, one or more discrepancies between the current PCB design and a guideline for the PCB design from the PCB data store based on a size of each of the one or more discrepancies;

determining, by a determination engine, changes needed to resolve the one or more discrepancies; and reporting, by a reporting engine, the one or more discrepancies to a user via a display logically connected to the computer system.

19. The computer program product of claim 18, wherein the current data object contains design data relating to the current PCB design; and wherein the identifying is run on the design data and the design data is included in the PCB data store for comparison to the current PCB design.

20. The computer program product of claim 19, wherein the reporting engine is further configured to make the changes to the current PCB design in response to the one or more discrepancies.

* * * * *